United States Patent [19]

Kung

[11] Patent Number: 4,528,463
[45] Date of Patent: Jul. 9, 1985

[54] BIPOLAR DIGITAL PERIPHERAL DRIVER TRANSISTOR CIRCUIT

[75] Inventor: David Kung, San Jose, Calif.

[73] Assignee: National Semiconductor Corporation, Santa Clara, Calif.

[21] Appl. No.: 394,028

[22] Filed: Jun. 30, 1982

[51] Int. Cl.³ .............................................. H03K 3/01
[52] U.S. Cl. ................................. 307/270; 307/296 R; 307/297
[58] Field of Search ................... 307/270, 296 R, 297, 307/303; 330/257, 288

[56] References Cited

U.S. PATENT DOCUMENTS 4,166,964 9/1979 Ahmed ................................ 307/270

OTHER PUBLICATIONS

I.B.M. Technical Disclosure Bulletin, vol. 20, No. 12, May 1978, "Low-Power Driver", V. A. Scotto et al, pp. 5160 and 5161.
Philips Technical Review, vol. 32, No. 1, 1971, "Integrated Linear Basic Circuits", Th. J, vanKessel et al, pp. 1-12.

Primary Examiner—Stanley D. Miller
Assistant Examiner—B. P. Davis
Attorney, Agent, or Firm—Gail W. Woodward; Paul J. Winters; Michael J. Pollock

[57] ABSTRACT

A digital driver circuit employs an output transistor having an uncommitted collector that can act as a current sink connectable to a peripheral element that is to be controlled. The base of the output transistor is coupled to a driver circuit that controls the output transistor conduction. The driver input is coupled to a pair of cascaded current mirrors which act to switch the driver off and on. An input stage is coupled to control the current mirrors in response to a low current logic signal.

4 Claims, 3 Drawing Figures

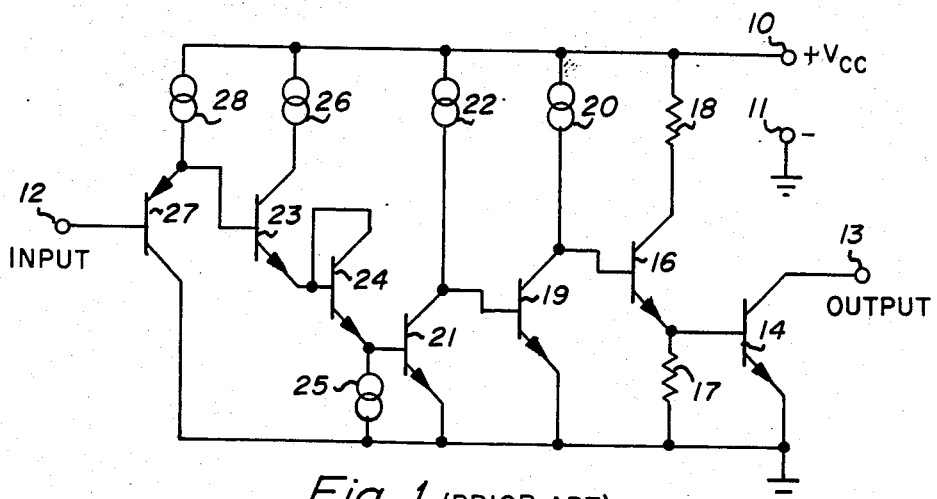
Fig_1 (PRIOR ART)
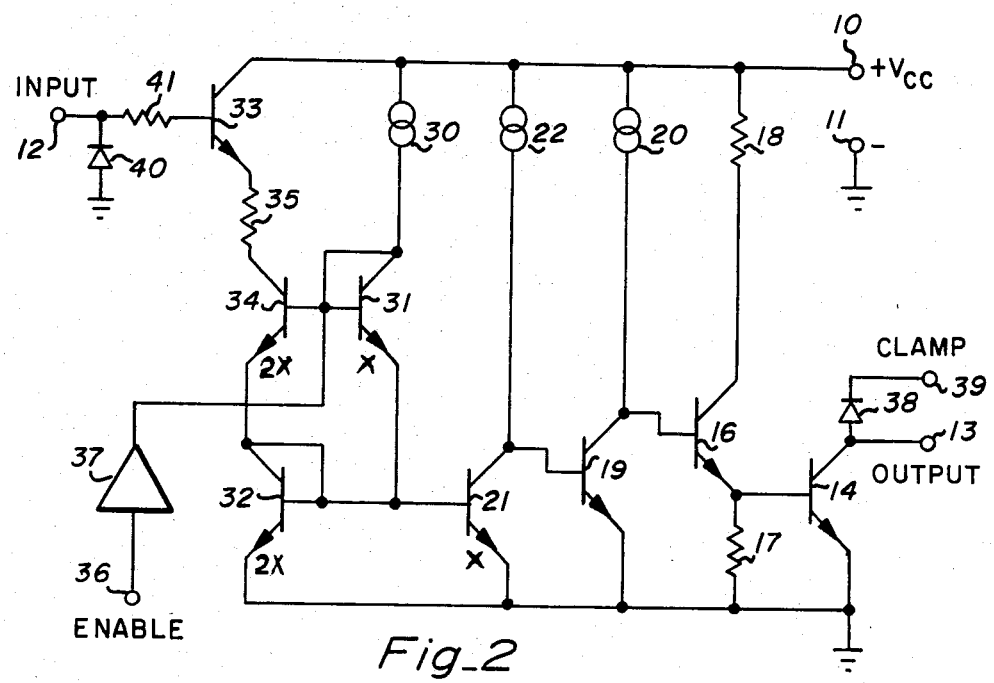
Fig_2
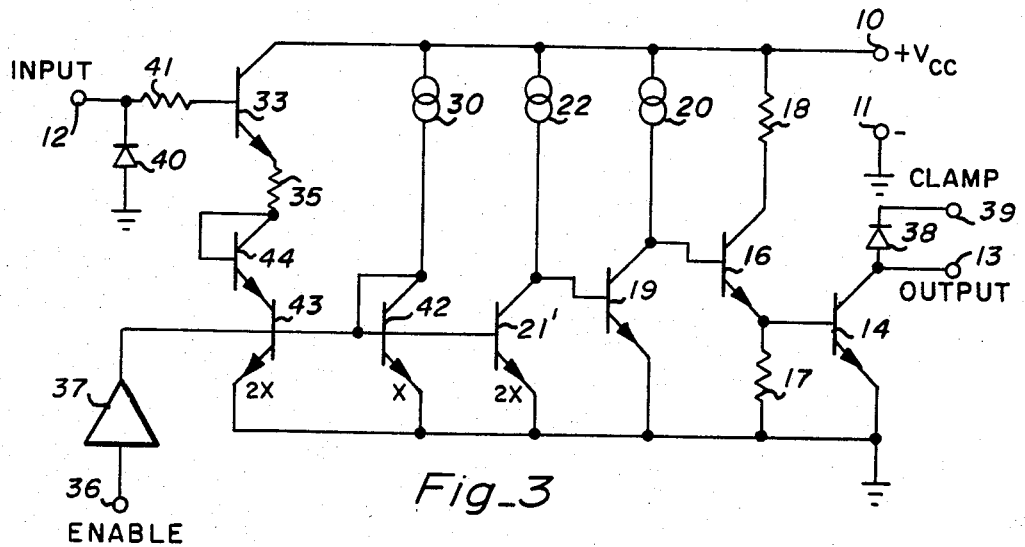
Fig_3

BIPOLAR DIGITAL PERIPHERAL DRIVER TRANSISTOR CIRCUIT

BACKGROUND OF THE INVENTION

Digital peripheral drivers are regarded as interface devices which switch high current high voltage loads in response to standard digital logical input signals between circuits that produce and respond to digital information. Such loads may be relays, solenoids, or other peripheral elements. The desirable qualities of peripheral driver circuits are low input current, high output voltage and current capability, and low power supply drain.

SUMMARY OF THE INVENTION

An output transistor employs an uncommitted collector to act as an output current sink to the circuit to be driven. The output transistor base is operated from a driver that swings the base potential from close to ground to a turn on condition where in the base current drive capability is sufficient to saturate the output transistor for its rated current. The driver is operated from an input circuit that is made up of a pair of coupled current mirrors. The first current mirror is coupled to operated the driver and is in turn driven from the second current mirror. The input stage includes an emitter follower NPN transistor that drives the second current mirror. Since the driver switching action is set by current mirror ratioing, its operation is governed mainly by geometric design. The input stage is constructed around an NPN transistor so its current gain is quite high and well controlled. Its maximum conduction is preset to a low level by the action of the second current mirror. Therefore the input current requirement is very low and well defined. The current mirrors and the driver are constructed so that very little current is used for circuit operation and a substantial part of the total current drain is applied as output transistor base drive.

BRIEF DESCRIPTION OF THE DRAWING

FIG. 1 is a schematic diagram of a simplified prior art digital bipolar transistor peripheral driver circuit.

FIG. 2 is a schematic diagram of the preferred circuit of the invention.

FIG. 3 is a schematic diagram of an alternative embodiment circuit.

DESCRIPTION OF THE PRIOR ART

In the prior art schematic circuit diagram of FIG. 1 a $V_{cc}$ power supply is coupled + to terminal and − to ground terminal 11. The input terminal 12 receives a low current standard logic signal and output terminal 13 provides a high current sink in response to the input. When terminal 12 is high, output transistor 14 will be on and will act as a current sink. The same conditions will exist when terminal 12 is open. When terminal 12 is low, transistor 14 will be off.

The control circuitry operates as follows. Switch transistor 16, connected as an emitter follower, drives the base of transistor 14. When transistor 16 is off resistor 17 pulls the base of transistor 14 low so as to turn it off. When transistor 16 is turned on resistor 18 determines the base current for transistor 14 and this current is selected to saturate transistor 14 at its maximum rated current.

Transistor 16 is operated from transistor 19 connected as a common emitter driver with load current source 20. A similar cascade inverter in the form of transistor 21 and current source 22 drives transistor 19. Using this driver arrangement, if transistor 21 is on, it turns transistor 19 off so that source 20 will pull the base of transistor 16 up so as to turn it, along with transistor 14, on. When transistor 21 is turned off, source 22 will turn transistor 19 on and this will pull the base of transistor 16 so as to turn transistors 16 and 14 off.

Transistor 23 has its emitter directly coupled to the base of transistor 21 by way of diode connected transistor 24. Current source 26 supplies the collector of transistor 23 and current sink 25 returns the base of transistor 21 to ground. Desirably current sink 25 is matched to source 26 or source 28, so that there is always sufficient current into the base of transistor 21 to turn it on when terminal 12 is high.

Input transistor 27 is a complementary device connected as an emitter follower with its load current source 28. When transistor 27 is turned off, due to a logic "high" input, source 28 will pull the base of transistor 23 up and turn it on. This pulls the base of transistor 21 up so as to turn it on. When transistor 27 is turned on, due to a logic "low" input, it will pull the base of transistor 23 low and turn it off. For this condition sink 25 will pull the base of transistor 21 low and turn it off.

The switching threshold $V_T$ at terminal 12 will be:

$$V_T = V_{BE21} + V_{BE24} + V_{BE23} - V_{BE27}$$

Where: The $V_{BE}$ values of the designated transistors are the base to emitter voltage that will turn the transistor on. Thus $V_T$ will be 2 $V_{BE}$ or close to 1.4 volt at room temperature.

DESCRIPTION OF THE INVENTION

FIG. 2 is a schematic diagram of the preferred circuit of the invention. Where equivalent parts are employed, with respect to FIG. 1, the same numbers are used. Note that from transistor 21 to output terminal 13 the circuits operate in the same manner. However the input circuits are substantially different.

For the following discussion it will be assumed that sources 20, 22, and 30 are matched to conduct a current I. Transistor 32 is constructed with its emitter area twice that of transistor 21. Transistor 34 has twice the emitter area of transistor 31. Diode connected transistor 32 forms a first current mirror with transistor 21 so that I flowing in source 30 will mirror I/2 in transistor 21. This is due to the 2:1 miror ratio. Since source 22 is also conducting I, the excess current must flow into the base of transistor 19 which will turn it on. This will pull the base of transistor 16 low so as to turn it off along with transistor 14. This set of conditions presumes that transistor 33 is turned off by virtue of a logic low at terminal 12 or an open input.

Transistor 34, which is a double area device, is connected to form a second current mirror with transistor 31. Thus when transistor 33 is turned on, by virtue of a logic "one" input at terminal 12, its conduction will be determined by the second current mirror at 2I because of the mirror ratio. This means that 3I will flow in transistor 32 which will be mirrored in transistor 21 as 1.5I because of the first mirror ratio. However since source 22 forces I into the collector of transistor 21, its excess conduction will saturate it and pull the base of transistor 19 low to turn it off. As a result source 20 will turn transistor 16, and hence transistor 14 on.

Resistor 35 is an optional component which can be included to add a series voltage drop in the emitter of transistor 33 to raise the circuit input switching threshold and permit the adjustment thereof. The switching threshold of FIG. 2 is:

$$V_T = V_{BE21} + V_{SAT34} + V_{R35} + V_{BE33}$$

Where $V_{SAT34}$ is the saturation voltage of transistor 34 and $V_{R35}$ is the voltage drop across resistor 35. It will be noted that the input current that is needed to trip the circuit is:

$$I_{IN} = 2I/B_{33} + 1$$

Where 2I is the current flowing in transistor 33 and $B_{33}$ is the current gain of transistor 33.

Since transistor 33 is an NPN device, and therefore has controlled and high gain in conventional IC construction, the required input current is low.

Some additional circuit embellishments are shown in FIG. 2. An enable terminal is shown at 36 connected to a buffer amplifier 37. The output of amplifier 37 is coupled to the base of transistor 34. When the ENABLE input is low, amplifier 37 will pull the base of transistor 34 low thereby preventing its conduction and turning the control circuit off. When the ENABLE input is high amplifier 37 allows the base of transistor 34 to float and operate normally as described above. Thus the ENABLE input creates a logical "and" input function.

In many applications driver circuits are coupled to operate inductive loads such as relays or solenoids. Such inductive loads can produce large spikes at the circuit output terminals when they are switched off. Diode 38 is connected to output terminal 13 and is returned to CLAMP terminal 39. When terminal 39 is connected to some controlled positive potential and transistor 14 turned off, diode 38 will clamp terminal 13 to one diode drop above the clamp potential. When transistor 14 is turned on its collector will drop to the level of its saturation voltage for the current being sunk and diode 38 will be reverse biased and in its low conduction state.

Diode 40 is connected as shown between terminal 12 and ground. Thus for any logic condition between + $V_{CC}$ and ground it will be reverse biased. Its leakage will hold terminal 12 close to ground when terminal 12 is allowed to float.

Resistor 41 is coupled in series with the base of transistor 33. This resistor is present to protect transistor 33 in the presence of overdrive on terminal 12.

FIG. 3 is an alternative embodiment of the invention that employs a different current mirror configuration. Where the parts are the same as those of FIG. 2 the same numbers are used. Initially it will be assumed that transistor 33 is off. Both transistor 43 and transistor 21' have a 2X 43 area with respect to diode connected transistor 42. Since the base-emitter of 2X transistor 43 parallels diode-connected transistor 42, a first current mirror is present with a 3:2 ratio. Thus a current I flowing in source 30 will result in 2I/3 sink current mirrored in transistor 21'. Since I in source 22 will flow toward the collector of transistor 21', the difference, I/3 will flow into the base of transistor 19 to turn it on. This in turn turns transistors 16 and 14 off.

When transistor 33 is turned on, 2I will flow in it as well as transistor 43. Thus 3I will flow in the parallel combination of transistors 42 and 43. This current will mirror 2I in transistor 21' which, because only I from source 22 can flow in its collector, will be in saturation. This action turns off transistor 19 so that transistors 16 and 14 will be on. As illustrated the circuit of FIG. 3 can also include the clamp and enable circuits described for FIG. 2 along with the input clamp diode.

However, the enable amplifier is coupled to the bases of transistors 21', 42, and 43. In the off state, produced by terminal 36 going low, amplifier 37 will turn the current mirrors off.

EXAMPLE

The circuit of FIG. 2 was constructed using conventional bipolar junction isolated IC design. The individual circuit chips each contained four line drivers (quad configuration). A single enable circuit operated all four drivers and the clamp diodes were operated in pairs from two clamp input pins. The devices were designated DS1658 and were intended for automotive applications. The parts had a 5-volt $V_{cc}$ rating but could be operated up to about 10 volts. The total supply current was about 65 ma maximum over $-40°$ C. to $105°$ C. The input current rating was 10 microamperes maximum at 5 volts and $\pm 10$ microamperes at 0.4 volt. The input threshold was between 0.8 and 2 volts over the range of $-40°$ C. to $105°$ C. These results were achieved using the following nominal resistor values in ohms in the circuit of FIG. 2.

| Resistor | Value |
| --- | --- |
| 17 | 3K |
| 18 | 300 |
| 35 | 2K |
| 41 | 2K |

The invention, along with alternative embodiments, has been detailed and an actual construction described. Alternatives and equivalents, within the spirit and intent of the invention, will occur to a person skilled in the art upon reading the foregoing description. Accordingly it is intended that the scope of the invention be limited only by the following claims:

I claim:

1. An integrated digital peripheral driver circuit comprising:
    an output stage capable of sinking relatively large values of current;
    driver means having an input responsive to an input signal for turning said output stage on and off;
    input means for supplying a signal for turning said driver means on and off comprising:
    first current mirror means having an input and an output coupled to said input of said driver means;
    second current mirror means having an input and an output coupled to said input of said first current mirror; and
    an input stage connected as an emitter follower coupled to drive said input of said second current mirror.

2. The circuit of claim 1 wherein said first and second current mirrors are ratioed with respect to said driver means to control the on and off states of said output means.

3. The circuit of claim 2 wherein said first current mirror comprises: an input current source connected to pass a constant current through a first diode means;

means for coupling said first diode means to said input of said driver means; and means for adjusting the current transfer in said first current mirror whereby said mirrored current is insufficient to saturate said driver means input.

4. The circuit of claim 3 wherein said second current mirror is coupled to said first current mirror, is driven by said input stage, and includes means for ratioing whereby when said input stage is rendered conductive by an input thereto, the current delivered by said first current mirror is sufficient to saturate the input of said driver means.

* * * * *